(12) United States Patent
Janssen et al.

(10) Patent No.: US 8,189,335 B2
(45) Date of Patent: May 29, 2012

(54) HEAT TRANSPORT ASSEMBLY

(75) Inventors: Robert H. C. Janssen, Beek (NL); Jacob Koenen, Sittard (NL); Franciscus Van Vehmendahl, Sittard (NL)

(73) Assignee: DSM IP Assets B.V., Heerlen (NL)

( * ) Notice: Subject to any disclaimer, the term of this patent is extended or adjusted under 35 U.S.C. 154(b) by 231 days.

(21) Appl. No.: 12/524,613

(22) PCT Filed: Jan. 29, 2008

(86) PCT No.: PCT/EP2008/000674
§ 371 (c)(1),
(2), (4) Date: Nov. 10, 2009

(87) PCT Pub. No.: WO2008/092635
PCT Pub. Date: Aug. 7, 2008

(65) Prior Publication Data
US 2010/0118495 A1    May 13, 2010

(30) Foreign Application Priority Data
Feb. 2, 2007    (EP) .................................... 07002361

(51) Int. Cl.
*H05K 7/20* (2006.01)
(52) U.S. Cl. ......... 361/708; 361/704; 361/717; 361/718
(58) Field of Classification Search .......... None
See application file for complete search history.

(56) References Cited

U.S. PATENT DOCUMENTS

| 4,869,954 A | * | 9/1989 | Squitieri ..................... 442/13 |
| 5,359,768 A | * | 11/1994 | Haley ......................... 29/840 |
| 5,545,473 A | * | 8/1996 | Ameen et al. ................. 428/212 |
| 5,936,893 A | * | 8/1999 | Merritt .................... 365/189.05 |
| 6,504,242 B1 | * | 1/2003 | Deppisch et al. ............. 257/707 |
| 7,168,484 B2 | * | 1/2007 | Zhang et al. ................. 165/185 |
| 2003/0152773 A1 | * | 8/2003 | Chrysler et al. ............. 428/408 |
| 2005/0280142 A1 | * | 12/2005 | Hua et al. .................... 257/707 |
| 2006/0127672 A1 | * | 6/2006 | Chrysler et al. ............. 428/408 |
| 2007/0119582 A1 | * | 5/2007 | Zhang et al. ................. 165/183 |
| 2007/0231967 A1 | * | 10/2007 | Jadhav et al. ................ 438/122 |
| 2008/0165502 A1 | * | 7/2008 | Furman et al. ............... 361/709 |

FOREIGN PATENT DOCUMENTS

| DE | 103 03 103 | 8/2004 |
| DE | 103 16 136 | 11/2004 |
| WO | 02/059965 | 8/2002 |
| WO | 2004/075261 | 9/2004 |
| WO | 2005/101501 | 10/2005 |

OTHER PUBLICATIONS

International Search Report for PCT/EP2008/000674, mailed Mar. 4, 2008.

* cited by examiner

*Primary Examiner* — Gregory Thompson
(74) *Attorney, Agent, or Firm* — Nixon & Vanderhye P.C.

(57) ABSTRACT

Heat transport assemblies are provided with a first part plastic part and a second part. The heat transport assemblies have a first surface area on the first part in heat conductive contact with a second surface area on the second part, wherein the first surface area and the second surface area consist of a surface material having a heat conductivity of at least 50 W/m·K.

11 Claims, No Drawings

HEAT TRANSPORT ASSEMBLY

This application is the U.S. national phase of International Application No. PCT/EP2008/000674, filed 29 Jan. 2008, which designated the U.S. and claims priority to Europe Application No. 07002361.9, filed 2 Feb, 2007, the entire contents of each of which are hereby incorporated by reference.

FIELD

The present invention relates to a heat transport assembly comprising two parts in heat conductive contact with each other, more particular to a heat transport assembly, wherein at least one of the two parts is a plastic part. The invention in particular relates to the interface surface properties of a heat dissipation device such as a heat sink for use in connection with heat generating electronic devices.

BACKGROUND AND SUMMARY

Such a heat transport assembly is known from U.S. Pat. No. 6,651,732-B2. The known heat transport assembly is a heat dissipating assembly consisting of a heat generating device comprising a heat pipe component and a heat sink being a plastic part having an integral pocket for receiving the heat pipe component. The plastic part in the assembly of U.S. Pat. No. 6,651,732-B2 is an injection molded thermally conductive elastomeric part.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips generate a great deal of heat during operation, which must be removed to prevent adverse effects on operation of the system into which the device is installed. There are a number of prior art methods to cool heat generating components and objects to avoid device failure and overheating. Often, block heat sinks or heat spreaders are placed in thermal communication with the surface of the heat-generating device to absorb heat and to help dissipate heat therefrom.

It is well known that the contacting surfaces at the interface critically affect the overall performance of the heat transfer assemblies. A problem with existing heat transport assemblies is the following. Generally, due to manufacturing tolerances the contact surfaces are not always perfectly flat thus creating gaps between the heat generating surface and the heat dissipating devices and thereby increasing the overall thermal resistance of the assembly. Furthermore, surface irregularities, for example due to milling or other processing steps, create micro voids and gaps between the contacting parts. These imperfections and gaps between the contacting surfaces often contain small pockets of air. This all results in a bad heat conductive contact, reduction of the heat transfer potential across the interface between the heat generating surface and the heat-dissipating device, and leading to a sharp temperature gradient across the contacting interface. This reduction in heat transfer potential can be very critical for the performance of the heat transport assembly, in particular when one of the two contacting parts is a plastic part.

In the above cited U.S. Pat. No. 6,651,732-B2, the surface contact area between the heat generating device and the plastic heat sink part is enhanced by the heat pipe component comprised by the heat generating device integral pocket for receiving the heat pipe component comprised by the heat sink. This solution of enhanced surface contact area compensates for the bad heat conductive contact, but does not reduce or solve it.

In order to reduce the effect of the bad heat conductive contact and to minimize the resulting problem of the limited heat transfer potential, there have also been different attempts to bridge the interface gap with a thermally conductive material to provide an intimate contact between the surface of the heat sink and the surface of the heat generating source.

In particular, heat conductive pastes, films, adhesives consisting of organic base materials such as elastomeric rubbers, thermoplastic materials, pastes, oils and greases loaded with thermally conducting ceramics or other fillers have been used as thermal interface material. Thermally conductive pastes, oils and greases are typically applied by smearing the heat sink or other electronic component with the thermally conducting material and then securing the heat sink in place by mechanical means using clips or screws. Some of these materials show superior film forming and gap filling characteristics between uneven surfaces thus providing an intimate contact between the surface of the heat sink and the surface of the heat-generating source. These properties are generally combined with a low viscosity and/or low filler content, resulting in too high a thermal resistance and/or effectively seeping out from between the heat sink and the heat generating surface, causing air voids to form between the two surfaces, ultimately leading to hot spots. Moreover, excessive pressure placed upon the heat sink by the mechanical fasteners accelerates this seepage from between the heat sink and the surface of the heat-generating surface. Others show a high thermal conductivity due to high filler load, but generally also have very high viscosities and too low wetting and/or exhibit poor adhesion to the surfaces of the heat sink and heat generating surface, and are susceptible for voiding and drying out and ultimately leading to hot spots. Other problems are that some of the oils can evaporate and recondense on sensitive parts of the surrounding microcircuits. The recondensed oils lead to the deposite formation thereby interfering with the function of the microprocessor and eventually causing failure.

In the case of the heat conductive elastomeric rubbers and thermoplastic materials, these materials are typically cast in sheet form and die cut into shapes corresponding to the shape of the contact surface of the heat sink and heat generating device. The resulting preformed sheet is then applied to the surface of the contact surface of the heat sink or the heat generating device. The sheet must be very soft to replicate the contact surface of that part. For example, WO02/059965 describes a compressible phase change thermal interface, interposable between the heat transfer surfaces of a heat generating component and a thermally dissipating member. Often a heat conductive adhesive material is used in addition. Alternatively the layer of heat conductive material is cast directly onto the contact surface of either the heat sink or the heat generating device, thereby eliminating the need of heat conductive adhesive material. Than the heat sink and heat generating device with the interface surface layer of heat conductive material are secured by means of clips or screws. The interface surface layer consisting of a precast film or a precut film adhered to one part solves the problems associated with greases and alike, and generally has an intimate contact with the part onto which the film is adhered or cast.

However, to provide a good heat conductive contact with the second part, excessive pressure must be placed on the interface layer. Moreover, these types of materials do not provide adequate intimate contact with the second part required for optimum heat transference between the heat generating source and the heat sink in a heat transport assembly comprising a plastic part and/or show variable performance due to variation in the thickness of the thermally conducting precut or precast films and to the amount of pressure applied to the thermally conducting film, based upon the mechanical device or action used to secure the heat sink.

The aim of the invention is to reduce or even fully eliminate the above mentioned problems and to provide a heat transport assembly having a good thermal communication between at least one plastic part in heat conductive contact with another part, more particularly to lower the sensitivity of the assembly's thermal contact resistance for irregularities and roughness of the surfaces in thermal contact and for to make the assembly's thermal contact resistance low and less critical to micro-void formation while still having a good thermal communication between the two parts.

This aim has been achieved with the heat transport assembly comprising a first part being a plastic part and a second part, and having a first surface area on the first part in heat conductive contact with a second surface area on the second part, wherein the first surface area and the second surface area consist of a surface material having a heat conductivity of at least 50 W/m·K.

DETAILED DESCRIPTION

In the heat transport assembly according to the invention either only the first part is a plastic part or both the first and the second part are plastic parts. The effect of the contact surface areas of the plastic part and of the other part, or of both plastic parts, in the heat transport assembly according to the invention consisting of a surface material with a heat conductivity of at least 50 W/m·K is that the thermal contact resistance of the heat transport assembly is low and less sensitive for irregularities and roughness of the two contact surfaces and less critical to void formation. This effect results in a largely improved thermal communication between the two parts for the heat transport assembly according to the invention without taking any special precautions to reduce surfaces roughness, surface irregularities and micro-voids at or near the contact surface interface, compared to a corresponding heat transport assembly without a metal contact surface area or equivalent on the plastic part. In fact the surface irregularities of the two parts in the assembly according to the invention are hardly compensated, in particular when the layer of surface material with a heat conductivity of at least 50 W/m·K is thin, and nevertheless, the thermal communication between the two parts is significantly improved by that layer. The thermal communication is also better compared with that of a corresponding heat transport assembly comprising a thermal interface material according to the state of the art meanwhile having the same extent of surfaces roughness, surface irregularities void at or near the contact surface interface.

The surface material with a heat conductivity of at least 50 W/m·K suitably consists of metal, a metal comprising coating and/or a ceramic material.

In one embodiment of the invention, the first surface area consists of a metallized layer, a metal comprising coating and/or a ceramic material, and wherein the other second part is a metal part.

In another embodiment of the invention the first part and the second part are plastic parts and each of the contact surfaces, being the first surface area and the second surface area, consists of a metallized layer, a metal comprising coating and/or a ceramic material.

The heat transport assembly according to the invention may consist of different parts serving different functions, provided the common function is to transfer heat from one part to the other. Suitably one part, being either the first part or the second part, is a heated part or a heat generating part, while the other part is a heat absorbing part and/or heat dissipating part.

Examples of heated parts that can suitably be used in the heat transport assembly according to the invention are metal heat parts in lighting constructions. Such metal parts may be heated by the lighting elements, either by contact heating and/or by induction. Examples of heat generating parts that can suitably be used in the heat transport assembly according to the invention are electronic components, such as integrated circuit chips.

Preferably, one part is a heat generating device, and the other part is a heat dissipating device, or heat sink. A heat dissipating device is herein defined as a part that is in placed in thermal communication with a heated or heat generating part and is able to absorb heat from the heated or heat generating part and to dissipate absorbed heat to the environment. Suitably, the heat dissipating device comprises cooling members such as fins, posts or pins, to assist in the dissipation of heat.

There are a number of prior art methods to cool heat generating components and objects to avoid device failure and overheating, as discussed above. A block heat sink or heat spreader is commonly placed into thermal communication with the heat-generating surface of the object to absorb and dissipate the heat there from. Such a heat sink typically includes a base member with a number of individual cooling members, such as fins, posts or pins, to assist in the dissipation of heat. The geometry of the cooling members is designed to increase the total surface area of the heat sink that is in contact with the ambient air for optimal heat dissipation. The use of such fins, posts of pins in an optimal geometrical configuration greatly enhances heat dissipation compared to devices with no such additional cooling members, such as a flat heat spreader.

Suitably, the heat transport assembly comprises a heat generating device as the plastic part, or one of the plastic parts. The heat generating device advantageously comprises the metallized layer or alternative heat conductive surface layer at a contact surface area where there are no restrictions in respect of interfacial electrical conductivity, whereas such a layer is absent at a contact surface area where the interfacial area must have a high electrical resistance.

In a preferred embodiment of the invention the heat transport assembly comprises a heat dissipating device as the plastic part, or one of the plastic parts. The advantage of a plastic part being a heat dissipating device is that the heat dissipating device can be produced with simpler processes with very complex shapes to provide for an enhanced heat dissipating surface area.

In the heat transport assembly according to the invention, the heat generating device suitably is an electronic component, such as a computer chip, or a lighting element, such as a LED mounted on metal core PCB, an incandescent lamp, an energy saving lamp or any lamp operated by LED's electronics, or a housing for such a lamp.

The plastic part in the heat transport assembly according to the invention, suitably consists of a thermally conductivity plastic composition, preferably a plastic composition having a thermal conductivity of at least 0.5 W/m·K. The thermal conductivity of the plastic composition may be as high as 40 W/m·K, or even higher, though this is difficult to accomplish with most of the usual thermally conductive fillers. More preferably the thermal conductivity is in the range of 1.0-30 W/m·K, still more preferably 2.0-25 W/m·K or even 3.0-20 W/m·K.

Suitably, the plastic part in the heat transport assembly according to the invention is made of a plastic composition comprising a polymer and a thermally conductive filler.

Suitably, the plastic composition in the plastic part comprises 30-90 wt % of the polymer and 10-70 wt % of the thermally conductive material, preferably 40-80 wt % of the polymer and 20-60 wt % of the thermally conductive material, wherein the wt % are relative to the total weight of the plastic composition. It is noted that the amount of 10 wt. % might be sufficient for one type of thermally conductive material to attain a through plane thermal conductivity of at least 0.5 W/m·K, such as for specific grades of graphite, whereas for others, such as pitch carbon fibres, boron nitride and in particular glass fibres, much higher wt. % are needed. The amounts necessary to attain the required levels can be determined by the person skilled in the art of making thermally conductive polymer compositions by routine experiments.

Suitably, the polymer is a thermoplastic polymer or a thermoset polymer. Suitable thermoset polymers include thermoset polyester resins and thermoset epoxy resins.

Preferably, the polymer comprises a thermoplastic polymer. The thermoplastic polymer suitably is an amorphous, a semi-crystalline or a liquid crystalline polymer, an elastomer, or a combination thereof. Liquid crystal polymers are preferred due to their highly crystalline nature and ability to provide a good matrix for the filler material. Examples of liquid crystalline polymers include thermoplastic aromatic polyesters.

Suitable thermoplastic polymers are, for example, polyethylene, polypropylene, acrylics, acrylonitriles, vinyls, polycarbonate, polyesters, polyesters, polyamides, polyphenylene sulphides, polyphenylene oxides, polysulfones, polyarylates, polyimides, polyethertherketnes, and polyetherimides, and mixtures and copolymers thereof.

Suitable thermally conductive filler is selected from the group consisting alumina, boron nitride, metal flakes and fibers, such as copper flakes and steel fibers, carbon, such as carbon fiber and expanded graphite, and combinations thereof.

In a preferred embodiment of the invention, the thermally conductive filler comprises boron nitride. The advantage of boron nitride as the thermally conductive filler in the plastic composition is that it imparts a high thermal conductivity while retaining good electrical insulating properties.

In another preferred embodiment of the invention, the thermally conductive filler comprises graphite, more particularly expanded graphite. The advantage of graphite as the thermally conductive filler in the plastic composition is that it imparts a high thermal conductivity already at a very low weight percentage.

The thermally conductive filler may be in the form of granular powder, particles, whiskers, fibres, or any other suitable form. The particles can have a variety of structures. For example, the particles can have flake, plate, rice, strand, hexagonal, or spherical-like shapes. Suitably, the thermally conductive fibers comprise glass fibres, metal fibres and/or carbon fibres. Suitable carbon-fibres, also known as graphite fibres, include PITCH-based carbon fibre and PAN-based carbon fibres.

The choice of thermally conductive material will depend on the further requirements for the heat conductive assembly and the amounts that have to be used depend on the type of thermally conductive material and the level of heat conductivity required for the plastic part.

Preferably, both low aspect and high aspect ratio thermally conductive materials, i.e. both thermally conductive fillers and fibres, are comprised by the plastic composition, as described in McCullough, U.S. Pat. Nos. 6,251,978 and 6,048,919, the disclosure of which are hereby incorporated by reference.

In the heat transport assembly according to the invention, the plastic part comprises a heat conductive layer such that the contact surface of the plastic part consists of metal, a metal comprising coating and/or a ceramic material.

The plastic part may be any plastic part obtainable from a plastic composition as described above, using any method suitable for making a plastic part from such a plastic composition, such as extrusion or injection moulding.

The metallized layer on the plastic part may result from any metallization process that is suitable for providing a plastic part with a metallized layer.

Suitably processes for applying a metallized layer on a plastic part include coating and metallization by electroless plating, sputtering, or metal vapor deposition.

Suitably, the metallization process is combined with a selective etching process to remove part of the metallized layer where not functional. The preferred choice will depend on the type of plastic composition used for making the plastic part. The plastic composition suitably is an inactive polymer composition, a pre-activated polymer composition or a combination of both. An inactive polymer composition may be metallized, for example, after surface modification with suitable additives. Such a composition, being different from a pre-activated plastic composition, cannot be metallized in a chemical metallization bath or converted into a metal platable composition by activation.

A pre-activated polymer composition is herein understood to be a plastic composition that itself cannot be metallized in a chemical metallization bath, but comprises a catalyzing additive that can be activated, thereby converting the composition into a metal platable composition. A metal platable composition is herein understood to be a composition that can be metallized in a chemical metallization bath. Selective activation can be applied on such a pre-activated polymer composition to create activated areas in order to metallize only pre-selected by metallizing in a chemical metallization bath.

The catalyzing additives that can be used in the pre-activated polymer composition can be any catalyzing additive that is suitable for use in the field of metallizing moulded polymer articles. Suitable catalyzing additives include for example, palladium containing additives, which can be activated by chemical activation processes, and metal-organic and metal oxide additives, such as mixed metal oxides with a spinel structure, which can be activated by electromagnetic radiation exposure, such as with IR or UV-laser. Examples of such palladium containing additives and metal-organic and metal oxide additives are known in the art per sé. Suitable mixed metal oxides with a spinel structure are described in, for example, US patent application US 2004/0241422.

Examples of suitable pre-activated polymer compositions are, for example, Vectra 820i or Vectra 820iPD LDS of Ticona; Vestodur CL 2230 or CL 3230 PBT of Degussa, Ultramid 4380 LS of BASF, Pocan TP710-004 PBT/PET of Lanxass.

In a preferred mode, the plastic part consists of a combination of a pre-activated polymer composition and an inactive polymer composition, injection moulded in a 2-K moulding process. Activation of the surface of the moulded part resulting from such a 2-K moulding process results in selective activation of the pre-activated polymer composition. Metallization of such an activated part results in a metallized layer pattern already defined in the injection moulding process. This has the advantage that the plastic part can be metallized only at the contact surface.

In another preferred mode, the plastic part is completely covered with the metallized layer.

The heat conductive layer on the plastic part in the heat transport assembly according to the invention, suitably has a thickness varying over a large range. Suitably the thickness is in the range of 0.01-1000 μm, preferably 0.1-100 μm, still more preferably 1-10 μm. A larger minimal thickness for the heat conductive layer is advantageous for an even better heat conductive contact with the other part and reduced surface resistance for heat transport.

Suitably, the heat conductive layer consists of a material with a heat conductivity in the range of 50-400 W/m·K, or even higher. Preferably, the heat conductivity is at least 100 W/m·K, more preferably at least 150 W/m·K, and even more preferably at least 200 W/m·K.

Also preferably, the heat conductive layer on the plastic part consists of a metallized layer. This provides the best heat conductive contact with the other part and the lowest surface resistance for heat transport.

The metallized layer suitably comprises, or even fully consists of a metal chosen from the group consisting of nickel (Ni), aluminum (Al), copper (Cu), silver (Ag), gold (Au), chromium (Cr), and mixtures thereof.

The metal comprising coating suitably is a nickel copper coating.

After the plastic part is provided with a metallized layer, or any other surface material with a heat conductivity of at least 50 W/m·K, or where applicable the two plastic parts are provided with a metallized layer or alternative surface material, the plastic part is assembled with the other part, being either a metal part or a second plastic part with a metallized layer, such that the plastic part and the other part are in contact with each other through the metallized layer, or where applicable, through the metallized layers. The contact between the metallized layer and the metal part, or between the two metallized layers, results in a good thermal contact with low thermal resistance without the need of application of a high pressure on the parts. Application of a high pressure often is not possible and a low pressure has the further advantage that the part integrity is also better retained.

The invention claimed is:

1. A heat transport assembly comprising a first plastic part having a first surface area and a second part having a second surface area, wherein the first surface area on the first plastic part is in heat conductive contact with the second surface area on the second part, and wherein the first surface area consists of a metallized layer and the second surface area consists of a surface material having a heat conductivity of at least 50 W/m·K.

2. The heat transport assembly according to claim 1, wherein the surface material of the second surface area consists of metal, a metal comprising coating and/or a ceramic material.

3. The heat transport assembly according to claim 1, wherein the second part is a metal part.

4. The heat transport assembly according to claim 1, wherein each of the first and second parts is a plastic part, and wherein each of the first surface area and the second surface area consists of a metallized layer.

5. The heat transport assembly according to claim 3, wherein the metallized layer has a thickness of 0.01-1000 μm.

6. The heat transport assembly according to claim 3, wherein the metallized layer comprises a metal chosen from the group consisting of nickel (Ni), aluminum (Al), copper (Cu), silver (Ag), gold (Au), chromium (Cr), and mixtures thereof.

7. The heat transport assembly according to claim 1, wherein the first part or the second part is a heat generating device and the other part is a heat dissipating device.

8. The heat transport assembly according to claim 7, wherein the heat generating device is an electronic component or a lighting element.

9. The heat transport assembly according to claim 7, wherein the heat dissipating device comprises cooling members.

10. The heat transport assembly according to claim 1, wherein the first plastic part consists of a plastic composition having a thermal conductivity of at least 1 W/m·K.

11. The heat transport assembly according to claim 10, wherein the thermal conductivity of the plastic composition is in the range of 2-20 W/m·K.

* * * * *